US009752808B2

(12) United States Patent
Nakamura et al.

(10) Patent No.: US 9,752,808 B2
(45) Date of Patent: Sep. 5, 2017

(54) TEMPERATURE MAINTAINING CASE

(71) Applicant: Panasonic Intellectual Property Management Co., Ltd., Osaka (JP)

(72) Inventors: Ken Nakamura, Kanagawa (JP); Hisashi Kanou, Kumamoto (JP); Noriaki Yukawa, Osaka (JP); Toshio Mitsuyasu, Kumamoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 145 days.

(21) Appl. No.: 14/958,765

(22) Filed: Dec. 3, 2015

(65) Prior Publication Data
US 2016/0178252 A1   Jun. 23, 2016

(30) Foreign Application Priority Data

Dec. 18, 2014  (JP) .................................. 2014-256114
Sep. 2, 2015   (JP) .................................. 2015-172966

(51) Int. Cl.
*F25B 21/04*   (2006.01)
*F25D 11/00*   (2006.01)
*H01L 35/30*   (2006.01)

(52) U.S. Cl.
CPC ............ *F25B 21/04* (2013.01); *F25D 11/006* (2013.01); *F25B 2321/023* (2013.01);
(Continued)

(58) Field of Classification Search
CPC .... H01L 35/30; F25B 21/04; F25B 2321/023; F25B 2321/0251; F25B 2321/0252; F25B 2321/025; F25B 2321/0212; F25D 11/006; F25D 2700/12; F25D 31/007; F25D 2331/806; F25D 2400/12; F25D 11/02
(Continued)

(56) References Cited

U.S. PATENT DOCUMENTS 4,274,262 A * 6/1981 Reed ........................ F25B 21/02
                                                        62/3.64
4,301,658 A * 11/1981 Reed ........................ F25B 21/04
                                                        165/253

(Continued)

FOREIGN PATENT DOCUMENTS

JP    6-307752       11/1994
JP    2007-191209    8/2007

*Primary Examiner* — Mohammad M Ali
(74) *Attorney, Agent, or Firm* — McDermott Will & Emery LLP

(57) ABSTRACT

A temperature maintaining case includes a main body having a recessed storage chamber formed by a heat-insulating wall, and a lid body mounted on the main body capable of closing an opening of the storage chamber. Further, the temperature maintaining case includes: a heat storage member exposed to the storage chamber; a thermoelectric device having a first heat transferring surface and a second heat transferring surface opposite to the first heat transferring surface, the first heat transferring surface being connected to the heat storage member; a control device configured to drive and control the thermoelectric device; and a cover member mounted on the main body. The cover member is capable of selecting an exposed state and a shielded state.

12 Claims, 13 Drawing Sheets

(52) U.S. Cl.
    CPC .. *F25B 2321/0251* (2013.01); *F25D 2700/12* (2013.01); *H01L 35/30* (2013.01)

(58) Field of Classification Search
    USPC .......................................................... 62/3.3
    See application file for complete search history.

(56) References Cited

U.S. PATENT DOCUMENTS

| | | | | |
|---|---|---|---|---|
| 4,823,554 | A * | 4/1989 | Trachtenberg | A47J 36/26 62/239 |
| 5,524,440 | A * | 6/1996 | Nishioka | A45C 15/00 62/3.6 |
| 5,771,788 | A * | 6/1998 | Lee | A21C 13/00 435/286.1 |
| 6,308,518 | B1 * | 10/2001 | Hunter | F25B 21/02 62/3.3 |
| 6,658,857 | B1 * | 12/2003 | George | F25B 21/04 165/121 |
| 2005/0005612 | A1 * | 1/2005 | Kennedy | A47J 27/004 62/3.3 |
| 2005/0210884 | A1 * | 9/2005 | Tuskiewicz | A47F 3/0408 62/3.6 |
| 2010/0081191 | A1 * | 4/2010 | Woods | B01L 7/52 435/303.1 |
| 2012/0186272 | A1 * | 7/2012 | Son | F25B 21/04 62/3.3 |

* cited by examiner

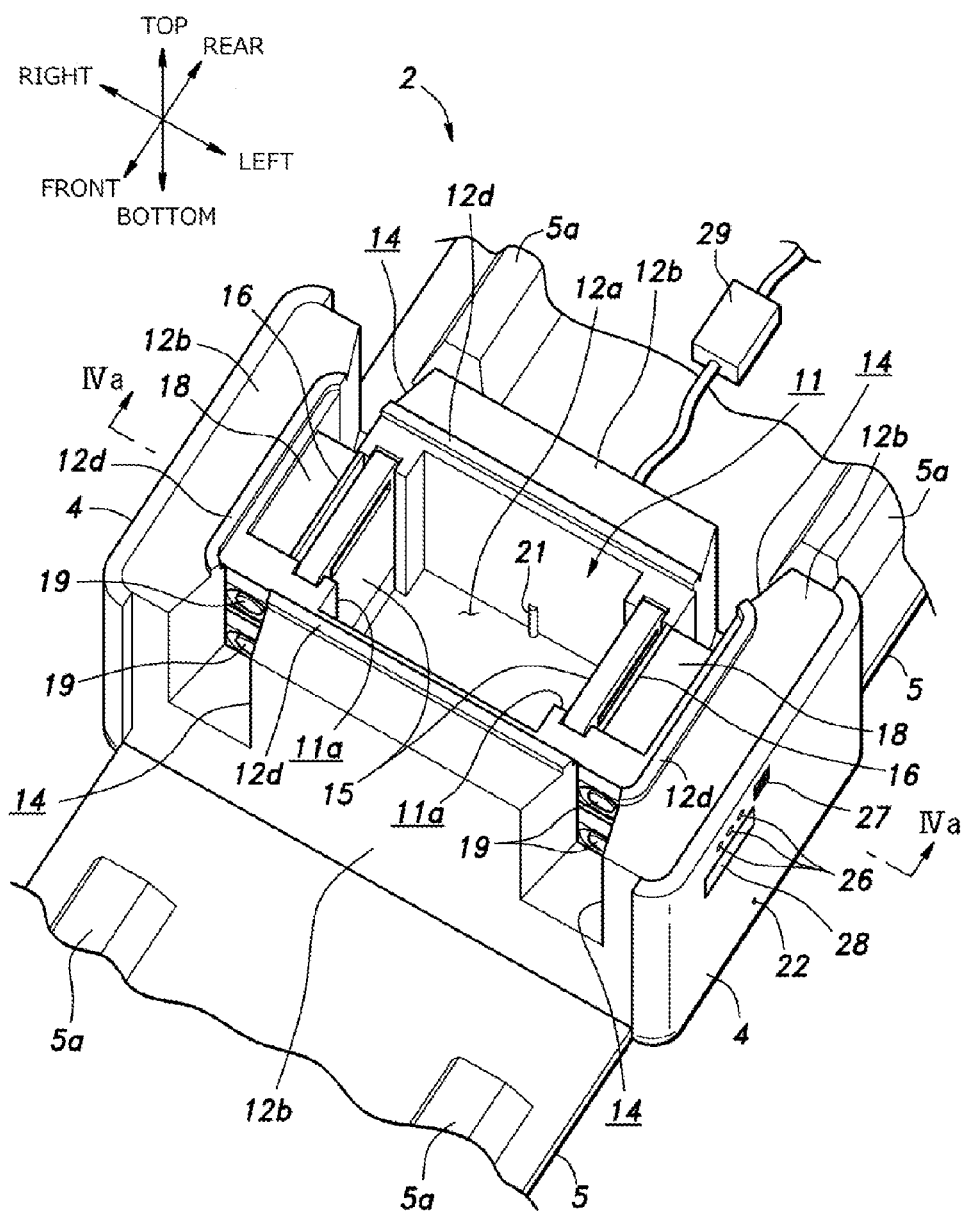

TEMPERATURE MAINTAINING CASE

BACKGROUND

1. Field of the Invention

The present disclosure relates to a temperature maintaining case including a thermoelectric device.

2. Description of the Related Art

Conventionally, there has been known a temperature maintaining case for transporting any substance such as foods or cell tissue while maintaining its temperature at a certain temperature (which may be a predetermined temperature range). In connection with the temperature maintaining case, in order to make it possible to maintain any substance at a certain temperature for long hours, a heat-insulating container is formed by stacking a plurality of heat-insulating members on the inner surface of the temperature maintaining case. In the heat-insulating container, an individual package container (a recessed container) and heat-storage containers are disposed. Then, between the individual package container and the heat-storage containers, heat-transferring members that transfer heat of the heat storage members to the surrounding of the individual package container are stacked (for example, see Unexamined Japanese Patent Publication No. 2007-191209).

Further, in other known technique, the temperature maintained state of longer hours is attained using a thermoelectric device such as a Peltier device (for example, see Unexamined Japanese Patent Publication No. H06-307752).

SUMMARY

A temperature maintaining case of the present disclosure includes a main body having a recessed storage chamber formed by a heat-insulating wall, and a lid body mounted on the main body capable of closing an opening of the storage chamber. Further, the temperature maintaining case of the present disclosure includes a heat storage member exposed to the storage chamber in order to maintain a temperature in the storage chamber within a predetermined temperature range with reference to a target temperature, and a thermoelectric device having a first heat transferring surface and a second heat transferring surface opposite to the first heat transferring surface, the first heat transferring surface being connected to the heat storage member. Still further, the temperature maintaining case of the present disclosure includes a control device configured to drive and control the thermoelectric device, and a cover member mounted on the main body. Then, the cover member is capable of selecting an exposed state in which the second heat transferring surface of the thermoelectric device is exposed to an outside, and a shielded state in which the second heat transferring surface of the thermoelectric device is shielded from the outside.

According to the present disclosure, the thermoelectric device can be in the shielded state or in the exposed state relative to the outside by using the cover member mounted on the main body. During transportation with a secured power supply, the temperature of the storage chamber can be maintained at a constant state by using the thermoelectric device. Also, during transportation with no power supply, the thermoelectric device becomes in the shielded state by using the cover member and heat transfer to the outside through the thermoelectric device is suppressed, whereby the temperature in the storage chamber can be maintained at a constant state by using the heat storage member.

BRIEF DESCRIPTION OF DRAWINGS

FIG. 3 is a view corresponding to FIG. 2 in a state where a lid body is removed;

DETAILED DESCRIPTION OF THE PREFERRED EMBODIMENTS

Figure 1:
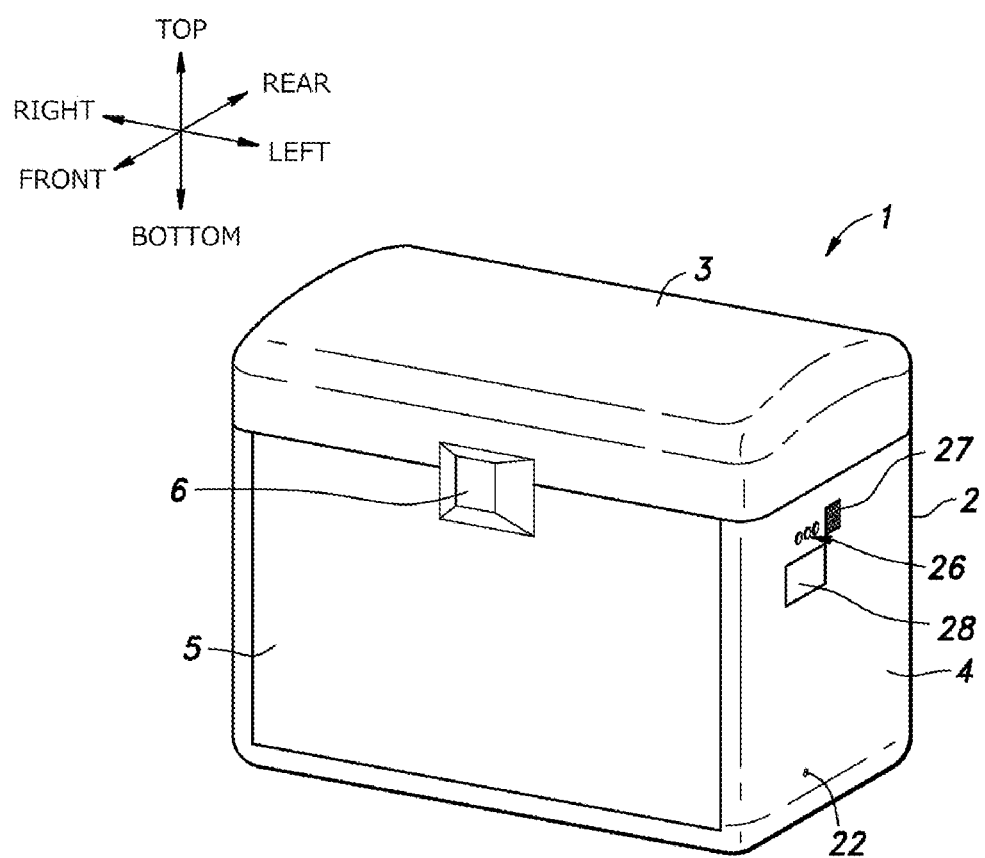
FIG. 1 is an exterior perspective view of a temperature maintaining case according to a first exemplary embodiment.

With the temperature maintaining case disclosed in Unexamined Japanese Patent Publication No. 2007-191209, in order to maintain a certain temperature for longer hours, the amount of the heat storage members must be increased. This invites a problem of an increase in size of the temperature maintaining case. On the other hand, with the temperature maintaining case disclosed in Unexamined Japanese Patent Publication No. H06-307752, a certain temperature can be always maintained in an environment where power can be supplied.

However, in the case where a thermoelectric device is used, such as the temperature maintaining case disclosed in Unexamined Japanese Patent Publication No. H06-307752, it is necessary to have an exhaust mechanism (air intake and discharge machines, and air intake and discharge ports) for dissipating heat generated by the thermoelectric device is necessary. On the occasion where a power supply cannot be secured during transportation, the outside air is taken in and discharged through the air intake and discharge ports, and heat is transferred via the thermoelectric device. Hence, there is a problem that the temperature maintained state cannot be kept. Accordingly, no problem arises when transportation is carried out with a vehicle having a power-supply purpose outlet (receptacle). However, when the temperature maintaining case is taken out from the vehicle at the destination and transported, power cannot be supplied, and therefore there arises a problem that the temperature maintained state cannot be kept when the transported distance is long.

The present disclosure has been devised to solve the problems associated with the conventional techniques, and provides a temperature maintaining case that can maintain the temperature in a storage chamber of the temperature maintaining case at a constant state without being influenced by the transportation state.

A first disclosure for solving the above-described problems provides a temperature maintaining case including: a main body having a recessed storage chamber formed by a heat-insulating wall; a lid body mounted on the main body capable of closing an opening of the storage chamber; a heat storage member exposed to the storage chamber in order to maintain a temperature in the storage chamber within a predetermined temperature range with reference to a target temperature; and a thermoelectric device having a first heat transferring surface and a second heat transferring surface opposite to the first heat transferring surface, the first heat transferring surface being connected to the heat storage member. The temperature maintaining case further includes a control device configured to drive and control the thermoelectric device, and a cover member mounted on the main body. Then, the cover member is capable of selecting an exposed state in which the second heat transferring surface of the thermoelectric device is exposed to an outside, and a shielded state in which the second heat transferring surface of the thermoelectric device is shielded from the outside.

Accordingly, since the thermoelectric device can be in the shielded state or in the exposed state relative to the outside by using the cover member mounted on the main body. During transportation with a secured power supply, the temperature of the storage chamber can be maintained at a constant state by using the thermoelectric device. Also, during transportation with no power supply, the thermoelectric device becomes in the shielded state by using the cover member and heat transfer to the outside through the thermoelectric device is suppressed, whereby the temperature in the storage chamber can be maintained at a constant state by using the heat storage member. Thus, without being influenced by the difference in the transportation state, i.e., whether or not a power supply is secured, the temperature of the storage chamber can be maintained at a constant state. Note that, the temperature maintaining case being the subject of the present disclosure maintains the temperature in the storage chamber at a constant state, and in order to maintain the temperature at a constant state, in one case the temperature is reduced and in other case the temperature is increased by the heat storage member or the thermoelectric device.

Further, a second disclosure provides, in the first disclosure, the heat storage member and the thermoelectric device are provided as being accommodated in the heat-insulating wall. The heat-insulating wall is provided with an outside air introducing passage for introducing outside air to the second heat transferring surface of the thermoelectric device. The outside air introducing passage is opened or closed by selecting of the exposed state of the cover member or the shielded state the cover member.

Accordingly, since the outside air introducing passage is interposed between the thermoelectric device and the outside of the main body, the thermoelectric device is not directly exposed to the outside air, and the heat insulating characteristic in the shielded state is improved.

Further, according to a third disclosure, in the second disclosure, the cover member has a projecting heat-insulating member buried and accommodated in the outside air introducing passage.

Accordingly, since the heat-insulating member is accommodated in the outside air introducing passage in the shielded state by the cover member, the heat insulating characteristic is further improved.

Further, according to a fourth disclosure, in the second disclosure, the heat storage member is provided to constitute part of a wall of the storage chamber.

Accordingly, on the side opposite to the side exposed to the storage chamber of the heat storage member, the first heat transferring surface of the thermoelectric device is mounted. This makes it possible to easily expose the second heat transferring surface of the thermoelectric device to the outside air introducing passage.

Further, according to a fifth disclosure, in the second disclosure, the second heat transferring surface of the thermoelectric device is formed of a heatsink attached to the thermoelectric device, and the heatsink has a portion exposed to the outside air introducing passage.

Accordingly, the heat transferring characteristic of the second heat transferring surface of the thermoelectric device exposed to the outside can be improved. Further, since the outside air flowing through the outside air introducing passage is brought into contact with the heatsink, the heat transferring performance of the thermoelectric device can be improved.

Further, according to the sixth disclosure, in the second disclosure, the outside air introducing passage penetrates through the main body, and a blower fan is disposed at least on one side of the outside air introducing passage.

Accordingly, the outside air flowing through the outside air introducing passage can be caused to forcibly flow by the blower fan, and the heat transferring characteristic of the second heat transferring surface of the thermoelectric device can be further improved.

Further, according to a seventh disclosure, in the first disclosure, the main body has a temperature sensor configured to detect the temperature in the storage chamber, an alarm device configured to issue an alarm by at least one of light and sound, and an alarm control circuit configured to cause the alarm device to issue the alarm when the temperature in the storage chamber exceeds the predetermined temperature range with reference to the target temperature.

Accordingly, when it is detected that the temperature in the storage chamber is outside the predetermined temperature range with reference to the target temperature, an alarm is issued by the alarm device by light or sound, whereby the user can quickly take any measures before the temperature largely deviates from the target temperature.

Further, according to an eighth disclosure, in the seventh disclosure, the alarm control circuit uses, as a power supply in the exposed state, outer power supply providing member connected for supplying power to the thermoelectric device, and uses, as the power supply in the shielded state, the thermoelectric device.

Accordingly, when the thermoelectric device is driven and controlled while connecting the outer power supply providing member, the outer power supply providing member can be used as the power supply for the alarm control circuit. Further, when the temperature is to be maintained by the heat storage member without driving the thermoelectric device, the thermoelectric device can generate power by the difference in temperature between the heat transferring surfaces of the thermoelectric device. Thus, alarm control can be performed using the thermoelectric device as the power supply.

Further, according to a ninth disclosure, in the eighth disclosure, a battery as an alternative power supply when the thermoelectric device generates small power is further included.

Accordingly, when the temperature difference between the heat transferring surfaces of the thermoelectric device is small, the power generated by thermoelectric device is small and therefore it is difficult to operate the alarm circuit. Here, by virtue of provision of the battery serving as the alternative power supply, irrespective of the level of power generation of the thermoelectric device, the alarm circuit can be actuated. Hence, the temperature in the storage chamber can be constantly monitored.

Further, according to a tenth disclosure, in the first disclosure, lock member is provided between the lid body and the cover member for fixing the cover member together with the lid body to the main body, and the lock member is capable of locking when the cover member enters the normal shielded state.

Accordingly, the cover member is fixed to the main body together with the lid body by the lock member capable of locking in the normal shielded state of the thermoelectric device from the outside, and locking is not achieved when the shielded state is incomplete. Therefore, the user can check that the shielded state is entered by setting the locked state. Thus, a reduction in the temperature maintaining performance because of an incomplete shielded state can be prevented.

Further, according to an eleventh disclosure, the outside air introducing passage includes: a first passage extending along the second heat transferring surface and having opposite ends each communicating with the outside; and a second passage extending from an intermediate portion of the first passage in a direction perpendicular to or crossing the second heat transferring surface, an extending end of the second passage communicating with the outside.

Accordingly, by virtue of provision of the outside air introducing passage having the first passage extending along the second heat transferring surface, and the second passage extending from an intermediate portion of the first passage in a direction perpendicular to or crossing the second heat transferring surface, the temperature at the opposite ends of the first passage of the outside air being in contact with the second heat transferring surface can be leveled, and consequently the uneven temperatures in the storage chamber can be suppressed.

Further, according to a twelfth disclosure, the outside air is introduced from the extending end of the second passage.

Accordingly, by the outside air being introduced from the second passage to the second heat transferring surface, heat transfer between the outside air and the second heat transferring surface is promoted. Accordingly, the cooling efficiency of the second heat transferring surface by the outside air can be improved.

In the following, a description will be given of exemplary embodiments of the present disclosure with reference to the drawings.

First Exemplary Embodiment

FIG. 1 is an exterior perspective view of temperature maintaining case 1 according to a first exemplary embodiment. Note that, when positional relationship is described as to the structure of temperature maintaining case 1, the description is based on the top/bottom, front/rear, and right/left directions represented by arrows in FIG. 1. As shown in FIG. 1, temperature maintaining case 1 is structured by quadrangular-box shaped main body 2, and flat plate-shaped lid body 3 covering the upper side of main body 2.

Figure 2:
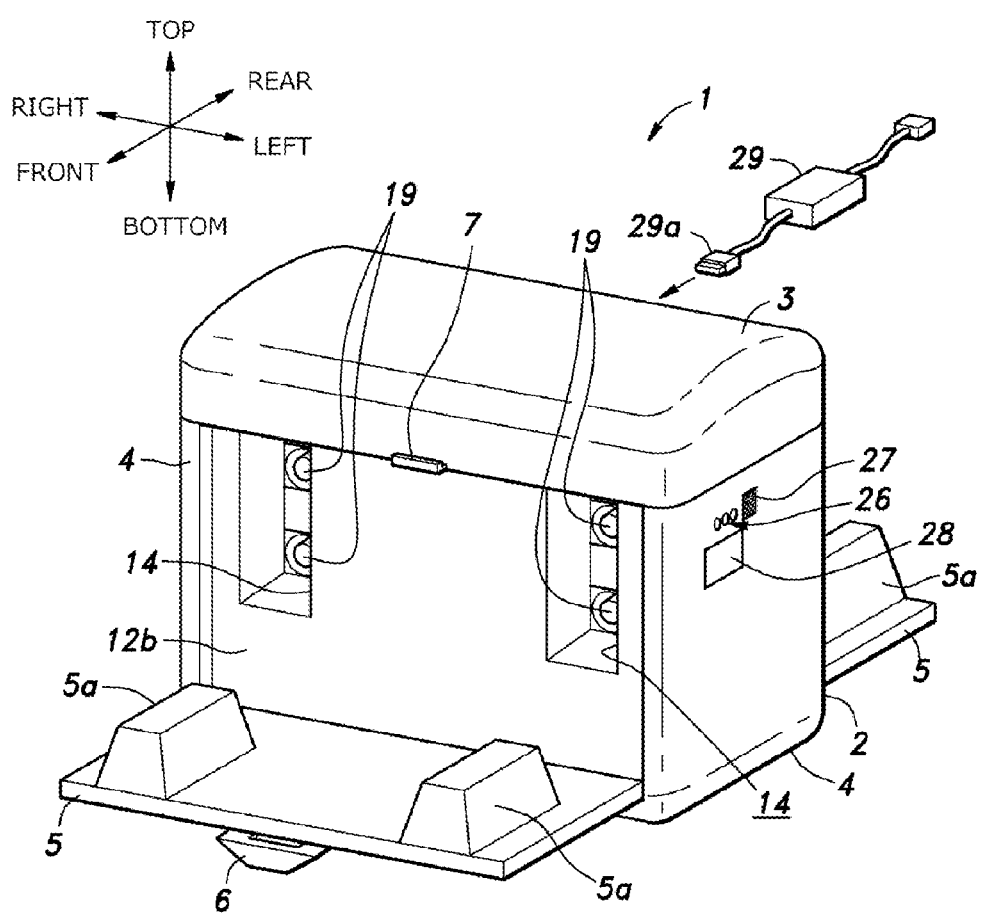
FIG. 2 is an exterior perspective view showing one example of usage manner of the temperature maintaining case according to the first exemplary embodiment.

As shown in FIGS. 2 and 3, the lower surface and the outer circumferential surface of main body 2 are formed by exterior member 4 and side plates 5 as the cover member, each made of a thin hard synthetic resin material. Side plates 5 are respectively hinge-connected at the lower edges of the front side and the rear side of main body 2, so as to be openable in the top/bottom direction. Hook 6 is provided at the center of the upper edge of each side plate 5, and hook receivers 7 are provided at corresponding portions of lid body 3. By hooks 6 and hook receivers 7, lock member is constitueded.

FIG. 3 is a view corresponding to FIG. 2 in a state where lid body 3 is removed. Main body 2 is formed into a quadrangular-box shape by thin exterior member 4 and both side plates 5, in which the upper side is opened when both side plates 5 are closed. On the inner side of the quadrangular-box shape formed by exterior member 4 and both side plates 5, a thick wall-like heat insulator is provided. By the heat insulator, bottom wall 12a and circumferential wall 12b as the heat-insulating walls defining recessed rectangular parallelepiped-shaped storage chamber 11 at the center of main body 2 are formed.

The right and left portions of circumferential wall 12b are formed to be thicker than the front and rear portions of circumferential wall 12b. The front and rear portions of circumferential wall 12b are each provided with a right and left pair of outside air introducing passages 14 penetrating in the front/rear direction. Outside air introducing passages 14 are formed to be groove-shaped opening toward the upper side of circumferential wall 12b. By closing the upper side opening with lid body 3 mounted on main body 2, outside air introducing passages 14 form the passages penetrating in the front/rear direction of main body 2.

Further, circumferential wall 12b is provided with communication passages 11a on the right and left outer sides of storage chamber 11, for communicating between the intermediate portions of outside air introducing passages 14 extending in the front/rear direction and the right and left portions of storage chamber 11. Note that, communication passages 11a are each also formed into a recessed shape opening toward the upper side of circumferential wall 12b, and the upper side opening is closed by lid body 3 mounted on main body 2.

On communication passages 11a, quadrangular plate-shaped heat storage members 15 are mounted. In each communication passage 11a, a pair of vertical grooves extending in the top/bottom direction and opposing to each other are formed. By the pair of grooves, the opposite side edge portions of each heat storage member 15 are supported. In this mounted state, communication passages 11a are closed by heat storage members 15. In this manner, one surfaces of heat storage members 15 are exposed at the right and left wall surfaces of storage chamber 11.

Figure 4A:
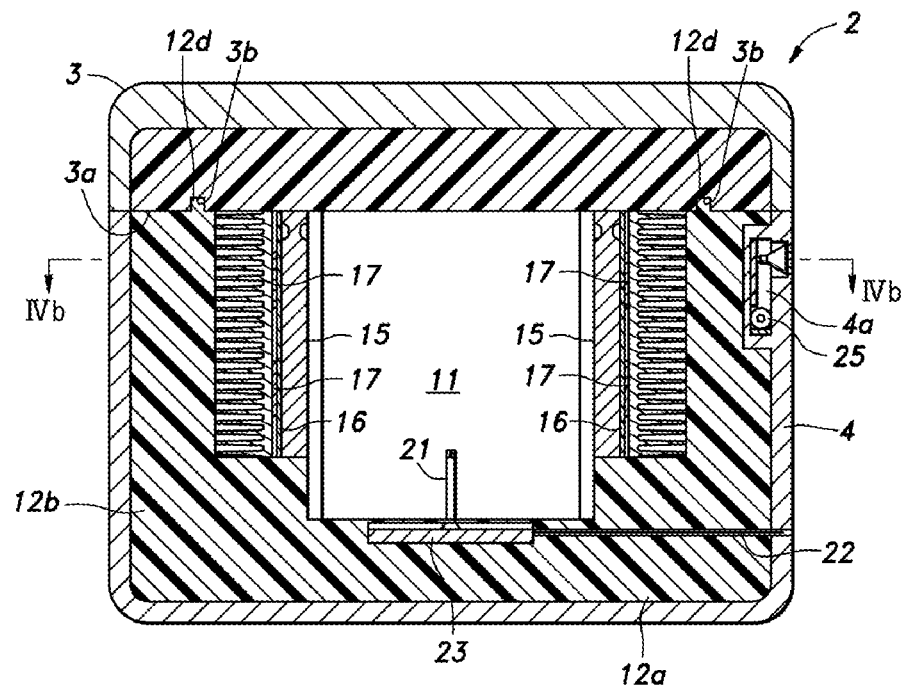
FIG. 4A is a cross-sectional view taken along line IVa-IVa in FIG. 3 and seen on the arrows.
Figure 4B:
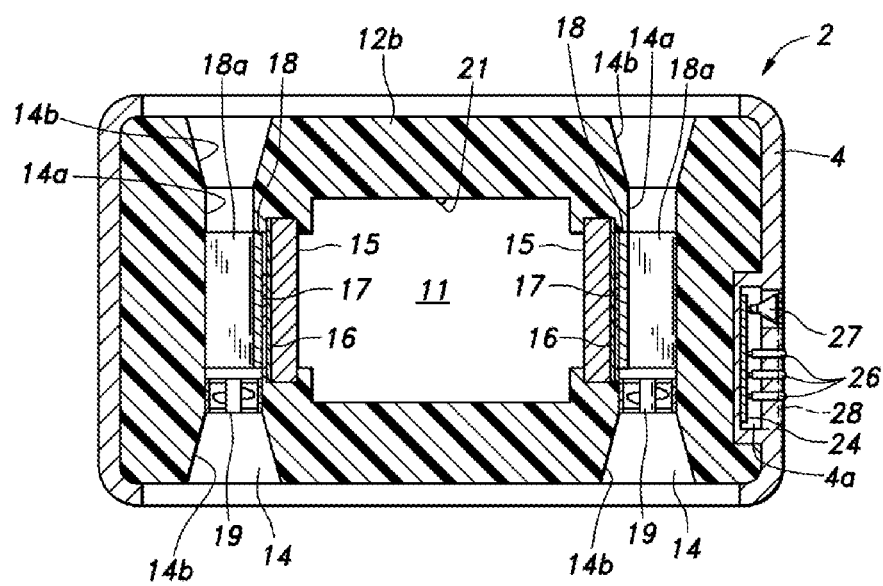
FIG. 4B is a cross-sectional view taken along line IVb-IVb in FIG. 4A and seen on the arrows.

FIG. 4A is a cross-sectional view taken along line IVa-IVa in FIG. 3 and seen on the arrows. FIG. 4B is a cross-sectional view taken along line IVb-IVb in FIG. 4A and seen on the arrows. The upper side opening of storage chamber 11 is closed by lid body 3 to become the ceiling of storage chamber 11. Similarly to main body 2, lid body 3 is constituted by an outer shell formed by a member made of a material identical to exterior member 4, and a heat insulator packed inside the outer shell. Lower surface 3a of lid body 3 has a flat surface formed by the heat insulator. In the state where lid body 3 is mounted on main body 2, the lower surface 3a of lid body 3 is brought into surface contact with the upper surface of circumferential wall 12b.

Further, on the upper surface of circumferential wall 12b, projection 12d having a quadrangular cross section is formed to surround storage chamber 11 as seen from above. At the corresponding part of lower surface 3a of lid body 3, annular groove 3b into which projection 12d can enter so as to tightly seal is formed. By lid body 3 being mounted on main body 2 to close the upper side opening of storage chamber 11 by lower surface 3a, a labyrinth structure in which projection 12d is fitted into annular groove 3b is attained, and storage chamber 11 is tightly sealed from the outside. Note that, projections 12d at the right and left portions of circumferential wall 12b are provided on the outer side of outside air introducing passages 14 (on the exterior member 4 side) as seen from above. This prevents communication between storage chamber 11 and the outside via the clearances between the upper side opening of outside air introducing passages 14 and lower surface 3a.

Figure 5:
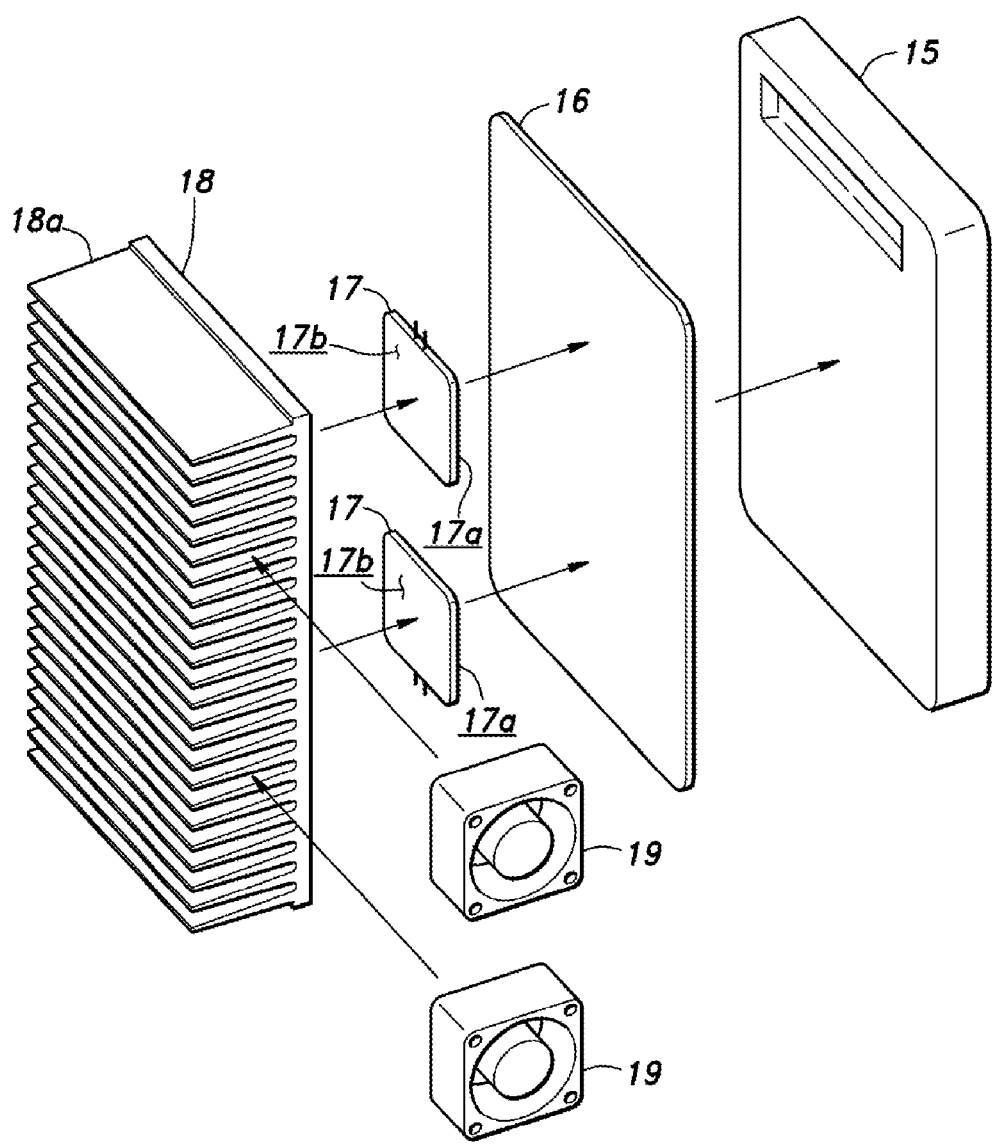
FIG. 5 is an exploded perspective view showing components surrounding a thermoelectric device according to the first exemplary embodiment.

FIG. 5 is an exploded perspective view showing components relating to cooling and temperature maintaining function of storage chamber 11. On heat storage member 15, on other side (outer side) opposite to one side (inner side) exposed to storage chamber 11, copper plate 16 as a heat conductor, thin plate-like thermoelectric devices 17 structured by a plurality of Peltier devices, and heatsink 18 are stacked in this order in intimate contact with each other. One heat transferring surface (first heat transferring surface) 17a of thermoelectric device 17 is attached to copper plate 16 in intimate contact with each other, and thick plate-like body portion of heatsink 18 is attached to other heat transferring surface (second heat transferring surface) 17b in intimate contact with each other. Thus, other heat transferring surface (second heat transferring surface) of thermoelectric device 17 is formed by heatsink 18 (heat transfer fins 18a and a surface at the base portion of heatsink 18 to which heat transfer fins 18a are connected, the surface being exposed at outside air introducing passage 14). Note that, in the example shown in the drawing, although two thermoelectric devices 17 are disposed on the surface of copper plate 16 in parallel to each other, the number and disposition thereof is not limited to the example in the drawing.

Inside each of outside air introducing passages 14 in the front portion of main body 2, two blower fans 19 are disposed one on top of the other. Blower fans 19 may send air into outside air introducing passage 14 from the front side to the rear side of main body 2, or may discharge air from the rear side to the front side. Note that, heat transfer fins 18a of heatsink 18 in a shape of a plurality of vanes are formed to be exposed in each outside air introducing passage 14, and to extend in parallel to each other in the axial direction of outside air introducing passages 14.

As shown in FIG. 4B, outside air introducing passages 14 each have straight passage portion 14a accommodating heatsink 18, and both widening passage portions 14b gradually increasing the width from the both ends of straight passage portion 14a toward the opening sides in the front/rear direction. Each side plate 5 is integrally provided with projecting heat-insulating members 5a that each has a complementary shape relative to widening passage portion 14b so as to be accepted by widening passage portion 14b in a buried manner. Thus, in a state where side plates 5 are completely closed relative to main body 2, projecting heat-insulating members 5a are packed in widening passage portions 14b. Thus, straight passage portions 14a are shielded from the outside by using projecting heat-insulating members 5a.

Figure 6A:
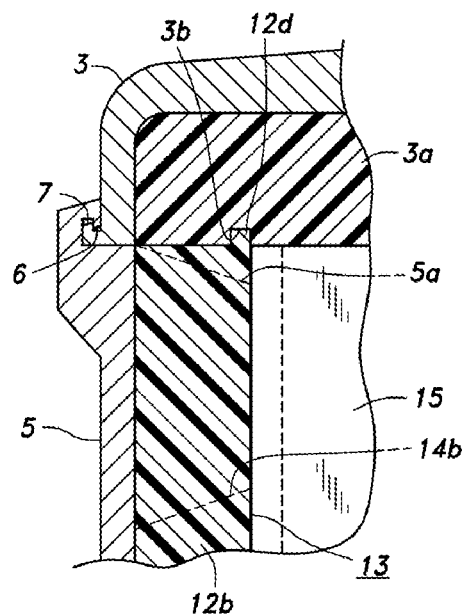
FIG. 6A is a cross-sectional view of a substantial part showing a state where a side plate is totally closed.
Figure 6B:
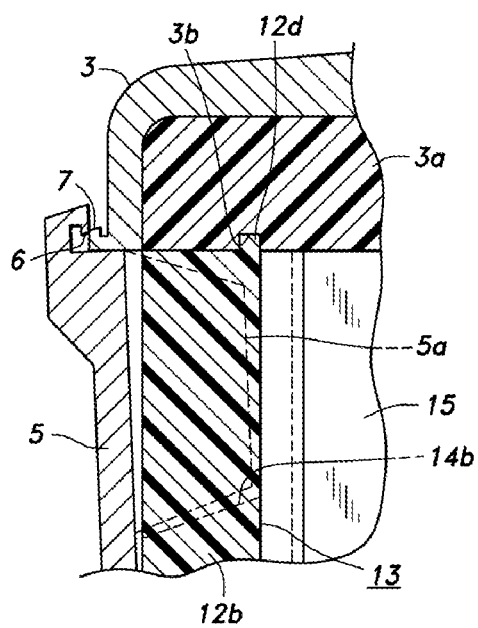
FIG. 6B is a view corresponding to FIG. 6A showing a state where the side plate is not totally closed.

FIG. 6A is a cross-sectional view of a substantial part showing a state where side plate 5 is totally closed. FIG. 6B is a view corresponding to FIG. 6A, showing a state where side plate 5 is not totally closed. As shown in FIG. 6B, when side plate 5 is not totally closed, projecting heat-insulating member 5a is not accommodated in widening passage portion 14b as being buried. In such a case, hook 6 and hook receiver 7 cannot engage with each other. Further, visually, side plate 5 does not become flush with the corresponding part of exterior member 4, and hook 6 at side plate 5 projects outward. Accordingly, the state where side plate 5 is open can be visually recognized. Thus, the user can easily check whether or not widening passage portion 14b, that is, outside air introducing passage 14, is tightly sealed from the outside.

Main body 2 is provided with in-case temperature sensor 21 for detecting an in-case temperature (the temperature in storage chamber 11) at an appropriate position at the inner wall surface of storage chamber 11. At an appropriate position at the outer wall surface of exterior member 4, outside temperature sensor 22 for detecting an outer air temperature outside temperature maintaining case 1 is provided. Temperature sensors 21, 22 may each be a thermocouple, and electrically connected to relay board 23 buried in bottom wall 12a.

Further, main body 2 is provided, at the left outer wall, with electric component storage portion 4a formed by part of exterior member 4 bulging inwardly. Electric component storage portion 4a stores control substrate 24 as a control device connected via wire to thermoelectric devices 17, blower fans 19, and relay board 23, and battery 25 as an alternative power supply. At the outer wall surface of exterior member 4, alert lamp 26 and alarm device 27 are disposed, and lid 28 that is opened for replacing battery 25 or performing maintenance of control substrate 24 and the like. In the example shown in the drawing, alert lamp 26 is constituted by three light emitting elements of blue, yellow and red (for example, LEDs). Further, alarm device 27 may be constituted by a small speaker.

Note that, as shown in FIG. 2, to main body 2, power supply adaptor 29 as outer power supply providing member is connected. Power supply adaptor 29 may be a known AC-DC adaptor, and connected to a power supply connector being any known structure (not shown) provided to main body 2, for supplying power from an outer power supply to control substrate 24.

Figure 7:
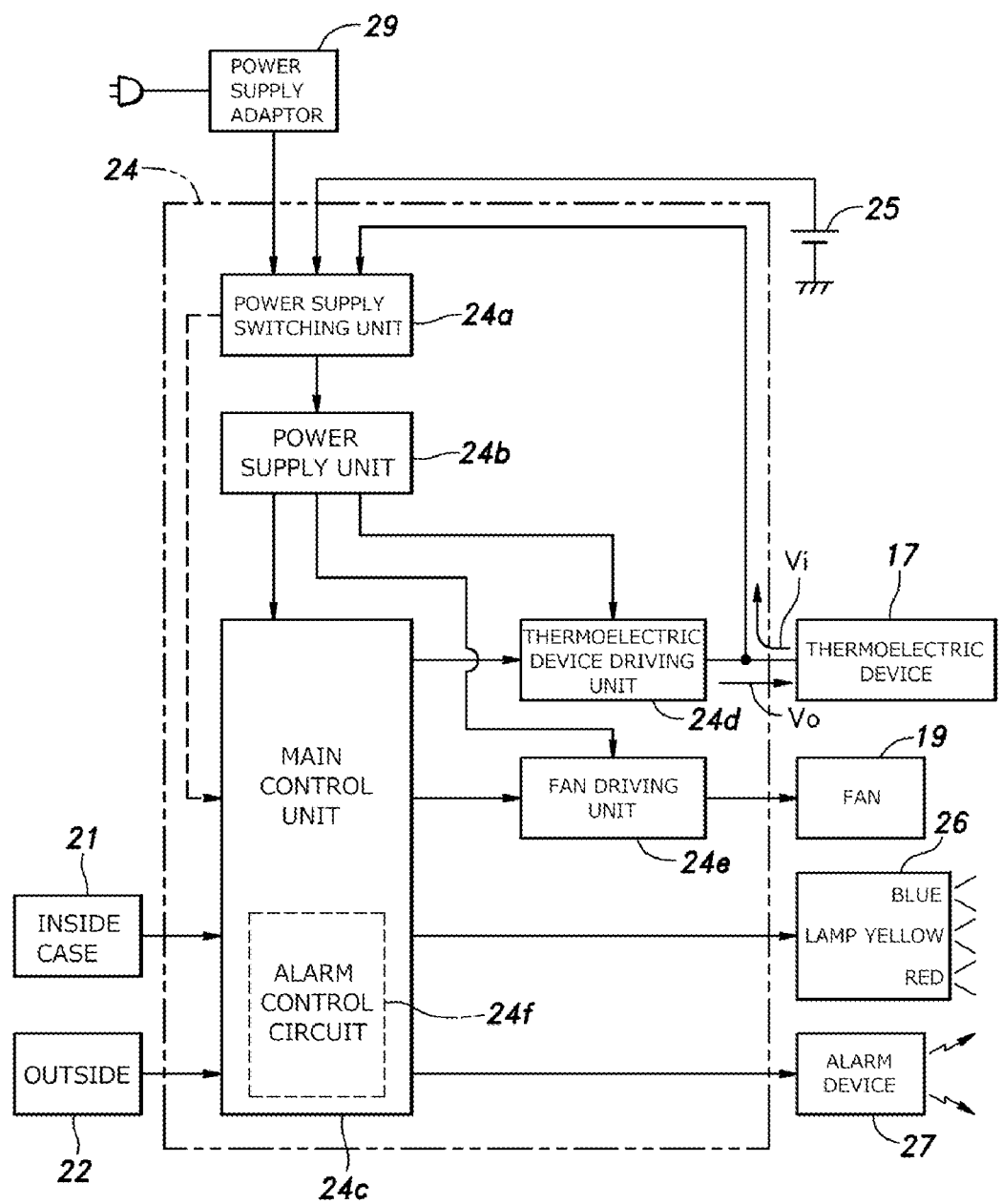
FIG. 7 is a block diagram of a substantial part of a control circuit according to the first exemplary embodiment.

FIG. 7 is a block diagram of a substantial part of a control circuit of temperature maintaining case 1. As shown in the drawing, control substrate 24 includes power supply switching unit 24a to which power supply adaptor 29 and battery 25 are connected, power supply unit 24b connected to power supply switching unit 24a, main control unit 24c supplied with power from power supply unit 24b, and thermoelectric device driving unit 24d and fan driving unit 24e similarly supplied with power from power supply unit 24b. To main control unit 24c, in-case temperature sensor 21 and outside temperature sensor 22 are connected.

Main control unit 24c may be a known structure using a CPU. From main control unit 24c, a drive signal driving thermoelectric devices 17 is output to thermoelectric device driving unit 24d, and a drive signal driving blower fans 19 is output to fan driving unit 24e. Further, a turn-on control signal is output to alert lamp 26, and an alarm control signal is output to alarm device 27. Still further, from power supply switching unit 24a, a power supply switching signal corresponding to whether or not power supply adaptor 29 is connected is input to main control unit 24c.

Figure 8:
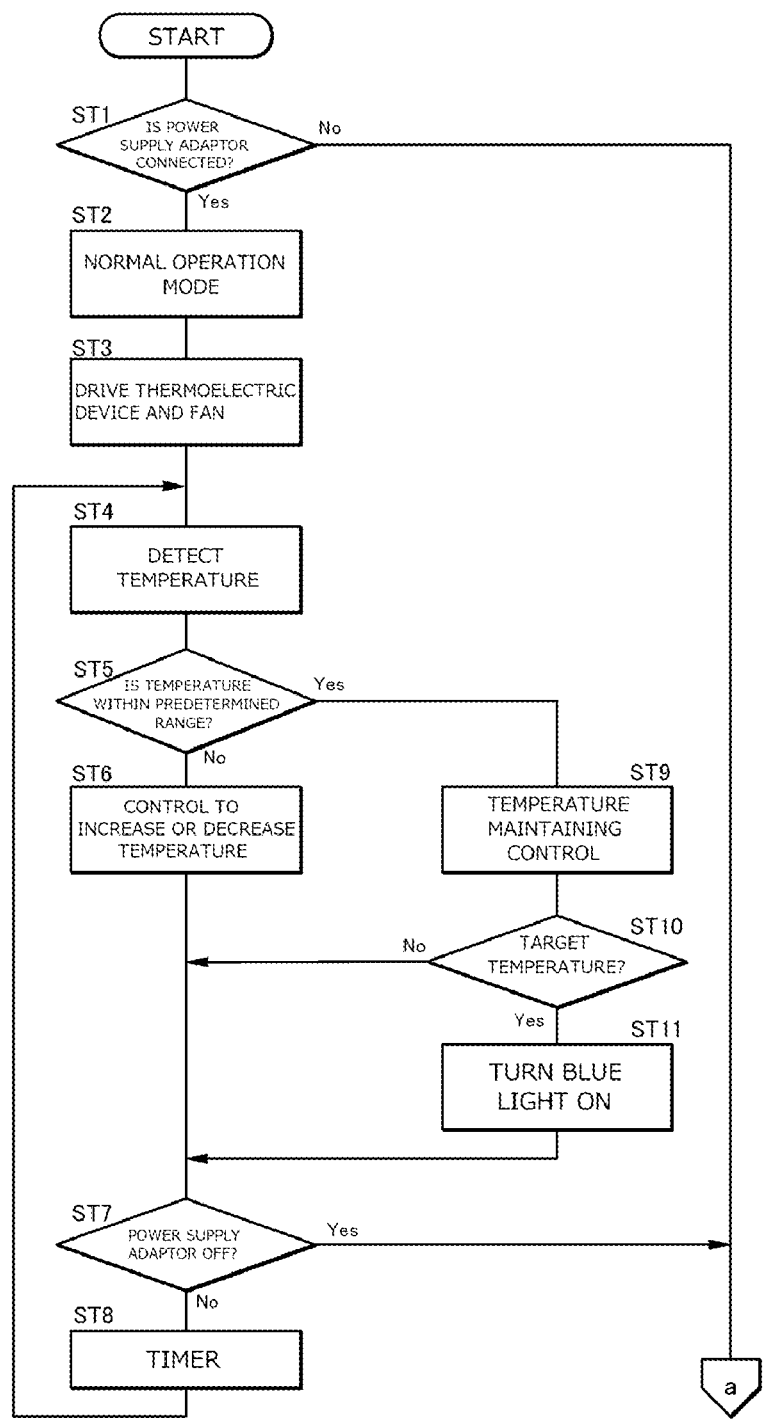
FIG. 8 is a flowchart of a normal operation mode according to the first exemplary embodiment.

FIG. 8 is a flowchart showing the control scheme in a block diagram of FIG. 7. Note that, control may be exerted by program control in main control unit 24c. Unless otherwise specified, the controlling subject is main control unit 24c.

In Step ST1, whether or not power supply adaptor 29 is connected is determined. When power supply adaptor 29 is connected, control proceeds to Step ST2, and a normal operation mode is set. Then, control proceeds to Step ST3. Note that, when there is a difference in temperature between the cooling surface and the heat releasing surface of each thermoelectric device 17, the power supply at this time may be thermoelectric devices 17 generating power from the temperature difference. In this case, as indicated by arrow Vi in FIG. 7, power is output from thermoelectric devices 17 to power supply switching unit 24a.

Note that, power supply switching unit 24a may be a device that selectively switches between the input line of power supply adaptor 29 and the input lines of thermoelectric devices 17 and battery 25, to connect to the output line to power supply unit 24b, in a manner of a two-position switch. For example, power supply switching unit 24a tilts a lever-type contact member, which is always biased by a spring toward the input terminal side of thermoelectric devices 17 and battery 25, to the input terminal side of power supply adaptor 29 by connection of connection connector 29a (see FIG. 2).

Note that, from power supply switching unit 24a to main control unit 24c, an adaptor connection signal indicative of the connected state of power supply adaptor 29 is output. The adaptor connection signal may be, for example, an ON/OFF signal of a contact that mechanically opens and closes by connection connector 29a being connected. Main control unit 24c determines whether or not connection connector 29a is connected based on the state of the ON/OFF signal to thereby perform the determination in Step ST1, and sets the normal operation mode in the subsequent Step ST2.

In Step ST3 and the following steps, control based on the normal operation mode is exerted. Firstly, in Step ST3, a thermoelectric device drive signal is output to thermoelectric device driving unit 24d. By the input of the drive signal, voltage is applied to the thermoelectric devices 17 as indicated by arrow Vo in FIG. 7 from thermoelectric device driving unit 24d, and thermoelectric devices 17 are driven. Further, a fan drive signal is output to fan driving unit 24e. By the input of the drive signal, fan driving unit 24e drives blower fans 19.

In next Step ST4, in-case temperature (the temperature in storage chamber 11) Ti and outer air temperature To detected by temperature sensors 21, 22 are stored for determining a temperature variation amount, which will be described later, and control proceeds to Step ST5. In Step ST5, determination is made as to whether or not the detected in-case temperature Ti falls within a predetermined temperature range (Ta+ΔTa>Ti>Ta−ΔTa), in which in-case temperature Ti can be regarded as being at a certain temperature with reference to target temperature Ta. When in-case temperature Ti is determined to be outside the predetermined temperature range, control proceeds to Step ST6. Note that, the predetermined temperature range is set to be narrower than the upper and lower limit values permitted for the stored object in storage chamber 11. That is, the range is set such that, even when in-case temperature Ti becomes outside the predetermined temperature range, the storage state of the object does not immediately deteriorate. The setting may be performed as follows. For example, a digital switch is previously provided to control substrate 24, and the user opens lid 28 and performs setting by manipulating a pin or the like.

When control proceeds to Step ST6, thermoelectric devices 17 are driven such that in-case temperature Ti falls within the predetermined temperature range. In this case, control should be exerted such that thermoelectric devices 17 are driven at the maximum output or around the maximum output, so that the predetermined temperature range is quickly achieved. Note that, in accordance with the magnitude of deviation (|Ta−To|) between target temperature Ta and outer air temperature To, the magnitude of the output to thermoelectric devices 17 may be adjusted.

In next Step ST7, whether or not power supply adaptor 29 is connected is determined. When it is determined that power is supplied by power supply adaptor 29, control proceeds to Step ST8. A predetermined time interval is waited based on a timer, and thereafter control returns to Step ST4. Then, Step ST4 and the following steps are repeated.

When it is determined in Step ST5 that in-case temperature Ti falls within the predetermined temperature range, control proceeds to Step ST9. When control proceeds to Step ST9, thermoelectric devices 17 can be controlled to drive at the output corresponding to the magnitude of the deviation between in-case temperature Ti and target temperature Ta. Accordingly, thermoelectric devices 17 can be driven at a smaller output than in Step ST6. Further, by correspondingly controlling the rotation of blower fans 19, blower fans 19 can be driven at lower speeds. Thus, a reduction in noises of temperature maintaining case 1 can be achieved.

In next Step ST10, whether or not in-case temperature Ti is maintained at target temperature Ta is determined. When it is determined that in-case temperature Ti is not maintained at target temperature Ta, control proceeds to Step ST7. When it is determined that in-case temperature Ti is maintained at target temperature Ta, control proceeds to Step ST11. For example, when the temperature of storage chamber 11 is maintained by latent heat of heat storage members 15, in-case temperature Ti can be maintained at target temperature Ta. In Step ST11, in order to inform the user that in-case temperature Ti is maintained at target temperature Ta, a turn-on signal for turning ON the blue lamp is output from alarm control circuit 24f to alert lamp 26. Thereafter, control proceeds to Step ST7. Thereafter, similarly to the manner as described above, Step ST4 and the following steps are repeated. Note that, the state where in-case temperature Ti is maintained at target temperature Ta is not limited to the state where in-case temperature Ti and target temperature Ta completely agree with each other.

Figure 9:
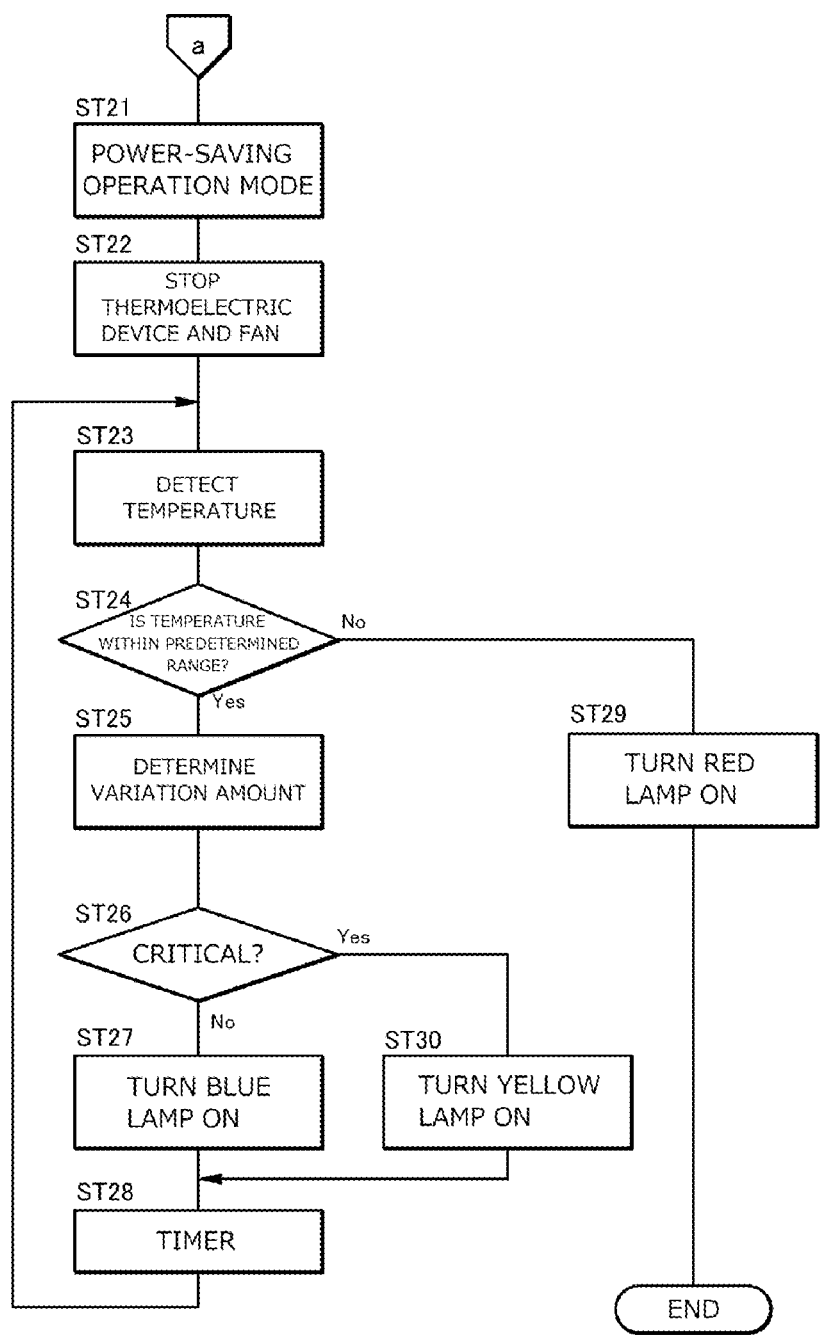
FIG. 9 is a flowchart of a power-saving operation mode according to the first exemplary embodiment.

Next, when it is determined in Step ST1 that power supply adaptor 29 is not connected, or when it is determined in Step ST7 that power supply adaptor 29 is disconnected, control proceeds to Step ST21 shown in FIG. 9. In Step ST21, instead of the normal operation mode, a power-saving operation mode being the mode in which temperature is maintained by heat storage members 15 is set, and control is exerted based on the power-saving operation mode in Step ST22 and the following steps.

Note that, when power supply adaptor 29 is disconnected, the user sets opposite side plates 5 in a totally closed state relative to main body 2, and establishes a locked state where hooks 6 engage with hook receivers 7. Thus, projecting heat-insulating members 5a of side plates 5 are buried in widening passage portions 14b of outside air introducing passages 14, and straight passage portions 14a of outside air introducing passages 14 are shielded from the outside. Thus, heat stored in heat storage members 15 is prevented from leaking outside.

Further, when power supply adaptor 29 is disconnected, in power supply switching unit 24a, the power supply line connecting between power supply adaptor 29 and power supply unit 24b is disconnected, and the power supply line connecting thermoelectric devices 17 and power supply unit 24b is connected. Accordingly, for supplying power to main control unit 24c in the power-saving operation mode, power generated by the difference in temperature between the opposite surfaces of each thermoelectric device 17 (the heat absorbing surface and the heat releasing surface) is used. Note that, a known two-input one-output circuit is implemented in power supply switching unit 24a, such that, when generated power is not sufficient for driving the electric components, power is supplied from battery 25. Thus, even when power generation of thermoelectric devices 17 is small, the monitoring state such as temperature detection is maintained.

Firstly, in Step ST22, the output of a thermoelectric device drive signal by thermoelectric device driving unit 24d is stopped, and the fan drive signal by fan driving unit 24e is stopped. Then, control proceeds to Step ST23. In Step ST23, similarly to Step ST4, in-case temperature Ti and outer air temperature To are detected and stored. Then, control proceeds to Step ST24.

In Step ST24, similarly to Step ST5, determination is made as to whether or not in-case temperature Ti falls within a predetermined temperature range (Ta+$\Delta$Ta>Ti>Ta−$\Delta$Ta) with reference to target temperature Ta. When it is determined that in-case temperature Ti falls within a target temperature range, control proceeds to Step ST25. In Step ST25, the variation amount of in-case temperature Ti from a previously detected value is calculated ($\Delta$Ti=Ti(n)−Ti(n−1)), and control proceeds to Step ST26. Note that, Ti (n) is a presently detected value, and Ti (n−1) is a previously detected value.

In Step ST26, whether or not variation amount $\Delta$Ti is equal to or greater than a predetermined value $\Delta$Td (<$\Delta$Ta) is determined. When variation amount $\Delta$Ti is less than the predetermined value $\Delta$Td ($\Delta$Ti<$\Delta$Td), it is determined that the variation amount has not reached a critical amount, and control proceeds to Step ST27. In Step ST27, since in-case temperature Ti is maintained within the target temperature range, blue light of alert lamp 26 is turned ON. In next Step ST28, a predetermined time interval is waited based on the timer, and thereafter control returns to Step ST23. Then, the steps following Step ST23 are repeated.

Accordingly, previously detected in-case temperature Ti (n−1) and presently detected in-case temperature Ti (n) used for calculating the variation amount in Step ST25 are the detected temperatures detected at time points with an interval of wait time based on the timer in Step ST28. Note that, when the process of Step ST25 is performed for the first time, it is regarded that Ti(n)=Ti(n−1).

In Step ST24, when it is determined that in-case temperature Ti is outside the target temperature range with reference to target temperature Ta, control proceeds to Step ST29. In Step ST29, since in-case temperature Ti is not maintained in the target temperature range, red light of alert lamp 26 is turned ON to inform that it is difficult to maintain the temperature in the power-saving operation mode, and this routine ends. In this case, the processes are repeated from Step ST1. The user connects power supply adaptor 29. When the normal operation mode in which the temperature is maintained by supply of external power is entered, Step ST2 and the following steps are executed. Note that, as in the example shown in the drawings, when alarm device 27 is provided, alarm device 27 can be sounded. This eliminates the necessity for the user to always monitor alert lamp 26.

Further, in Step ST26, when it is determined that variation amount $\Delta$Ti is equal to or greater than predetermined value $\Delta$Td, control proceeds to Step ST30. In Step ST30, yellow light of alert lamp 26 is turned ON. Thus, the user can be informed that it is becoming difficult to maintain in-case temperature Ti within the target temperature range, and can prepare connection of power supply adaptor 29 before red light of alert lamp 26 is turned ON.

Note that, as heat storage members 15, a material that can use latent heat at the target temperature is used, and the temperature of storage chamber 11 is maintained by latent heat. Thermoelectric devices 17 maintain the temperature by cooling or heating storage chamber 11 by changing the direction of current. When the normal operation mode in which the temperature of storage chamber 11 is maintained by thermoelectric devices 17 is executed, since thermoelectric devices 17 are not directly exposed to storage chamber 11 but heat is transferred through heat storage members 15 in the present exemplary embodiment, the temperature of heat storage members 15 is maintained at target temperature Ta in the normal operation mode. Accordingly, in the case where the occasion where temperature maintaining case 1 is transported by a vehicle or the like with a power outlet and the occasion where temperature maintaining case 1 is transported in the place where no connection for power supply adaptor 29 can be secured alternately take place, even when the heat storage amount of heat storage members 15 has been reduced in the power-saving operation mode, heat storage members 15 store heat by thermoelectric devices 17 in the following normal operation mode. Accordingly, the work of replacing heat storage members 15 can be eliminated.

Figure 10:
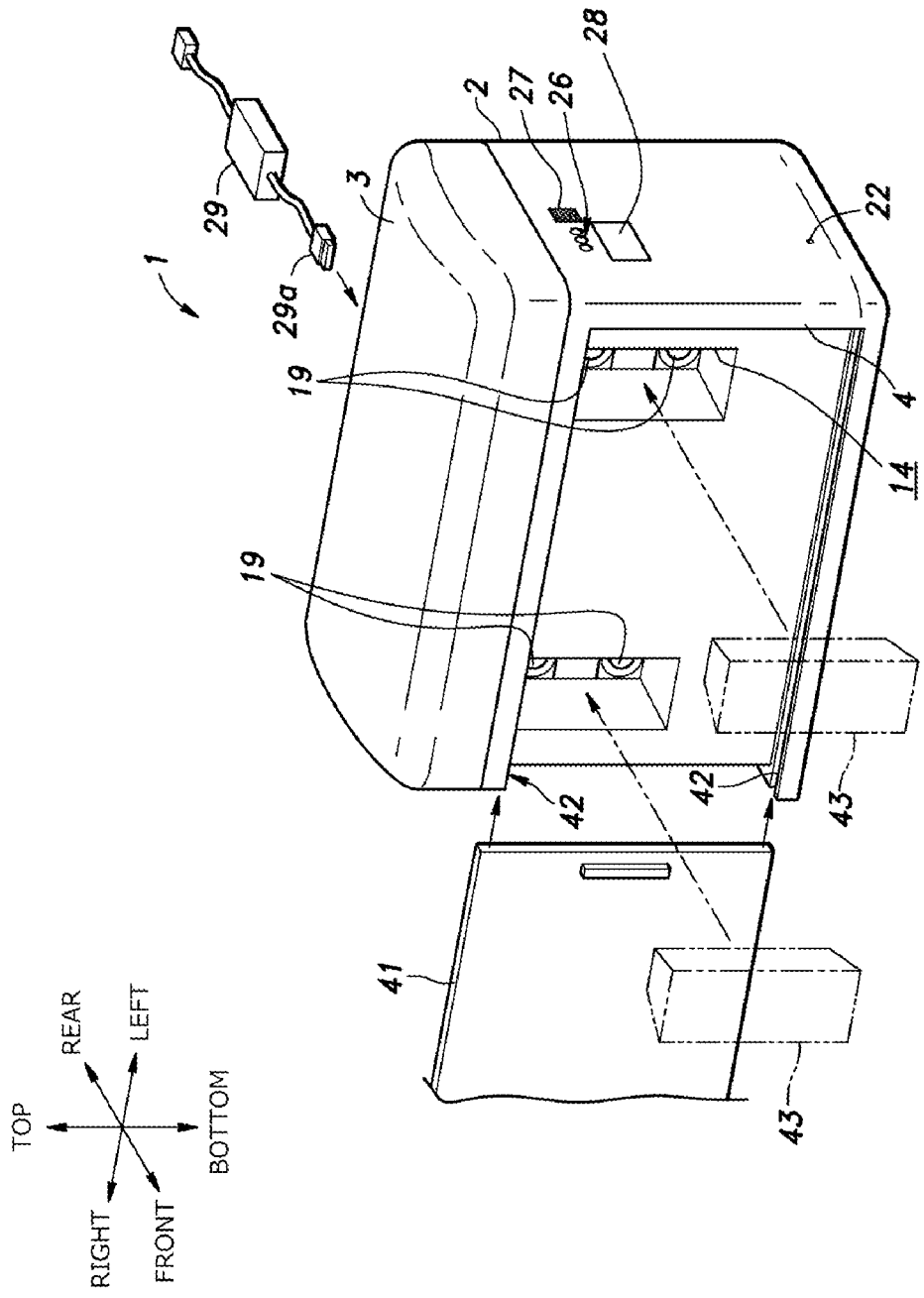
FIG. 10 is a view corresponding to FIG. 2 showing other structure of the side plates.

In the example shown in the drawings, in order to implement the structure establishing the communication state or the shielded state between the outside air introducing passages 14 and the outside, the structure having side plates 5 that can be inclined by hinges provided between the lower edge of main body 2 is shown. However, the structure of opening and closing outside air introducing passages 14 is not limited to the structure in which side plates 5 are inclined. One example of other structure is shown in FIG. 10. FIG. 10 shows a slide door structure including slide plate 41 of the size similar to that of the side surface of main body 2, and guide grooves 42 provided at the upper and lower portions of the side surface of main body 2 along the upper and lower edges. The upper and lower ends of slide plate 41 are guided and supported by guide grooves 42. When the user slides slide plate 41, outside air introducing passages 14 opened at the side surface of main body 2 can be closed or opened by slide plate 41. Note that, in the drawing, while only the front side is shown, the rear side is similarly structured.

In this case, each slide plate 41 is formed by a heat-insulating member, and a heat-insulating sealing member is arranged at the clearance between main body 2 and slide plate 41. Thus, similar insulating characteristic as in the example shown in the drawings can be secured. Note that, as indicated by a long dashed double-short dashed lines in the drawing, separate heat-insulating members 43 may be inserted and mounted into widening passage portions 14b.

Alternatively, a shutter structure that just opens and closes the openings of outside air introducing passage 14 may be employed. In the case of the shutter structure, two insulating plate-like bodies mutually approachable and separable by sliding may be provided at the opening of each of outside air introducing passages 14. The opening of outside air introducing passage 14 is shielded from the outside in the state where both plate-like bodies are closed in contact with each other, and opened in the state where they are separated from each other. In this case, since side plates 5 or slide plates 41 are not provided, the corresponding portions of circumferential wall 12b made of a heat insulator can be increased in thickness by the thickness of side plates 5 or slide plates 4. Thus, the heat insulating characteristic can be improved.

Second Exemplary Embodiment

Figure 11:
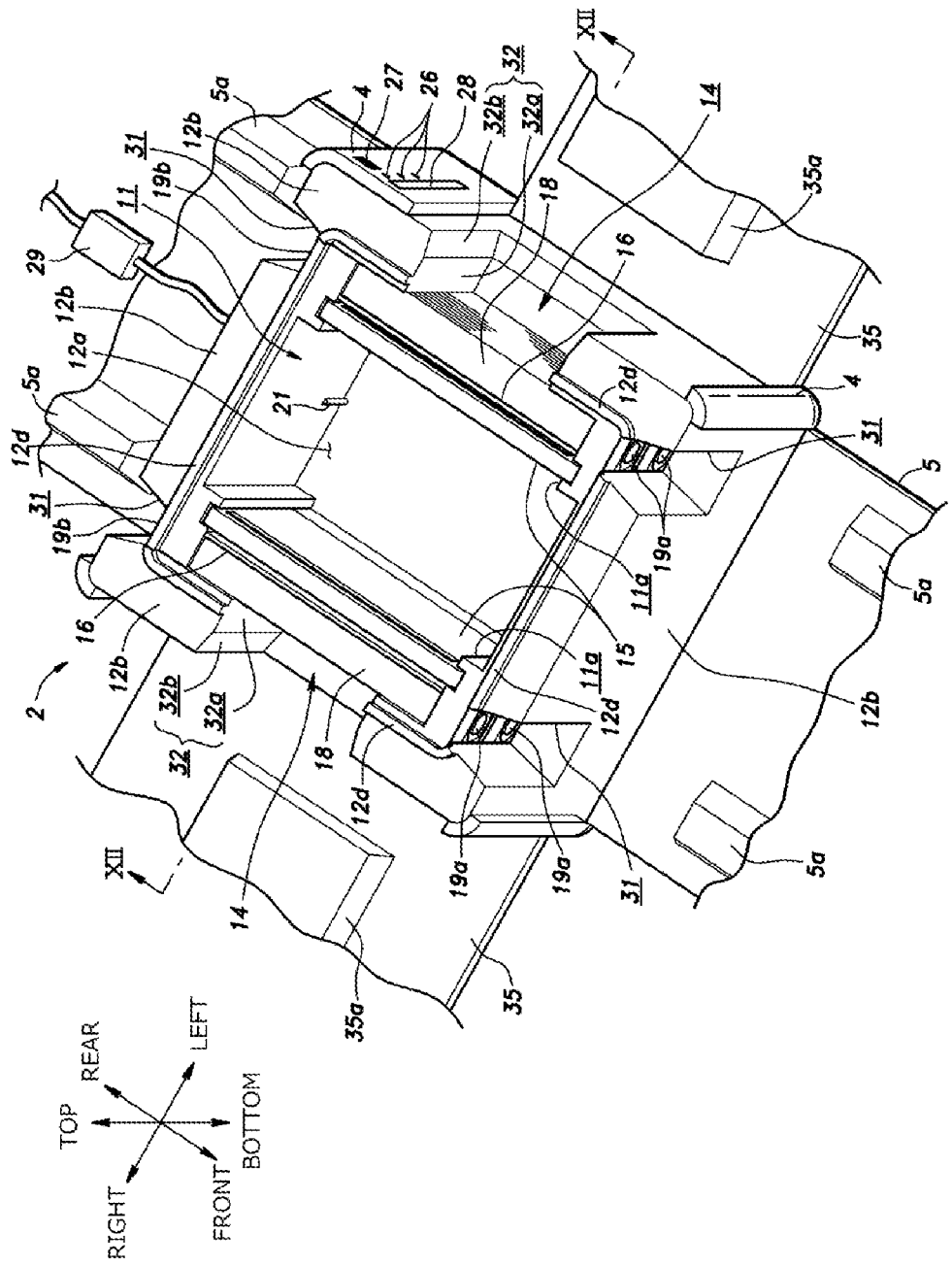
FIG. 11 is a view showing the state where a lid body of a temperature maintaining case according to a second exemplary embodiment is removed.
Figure 12:
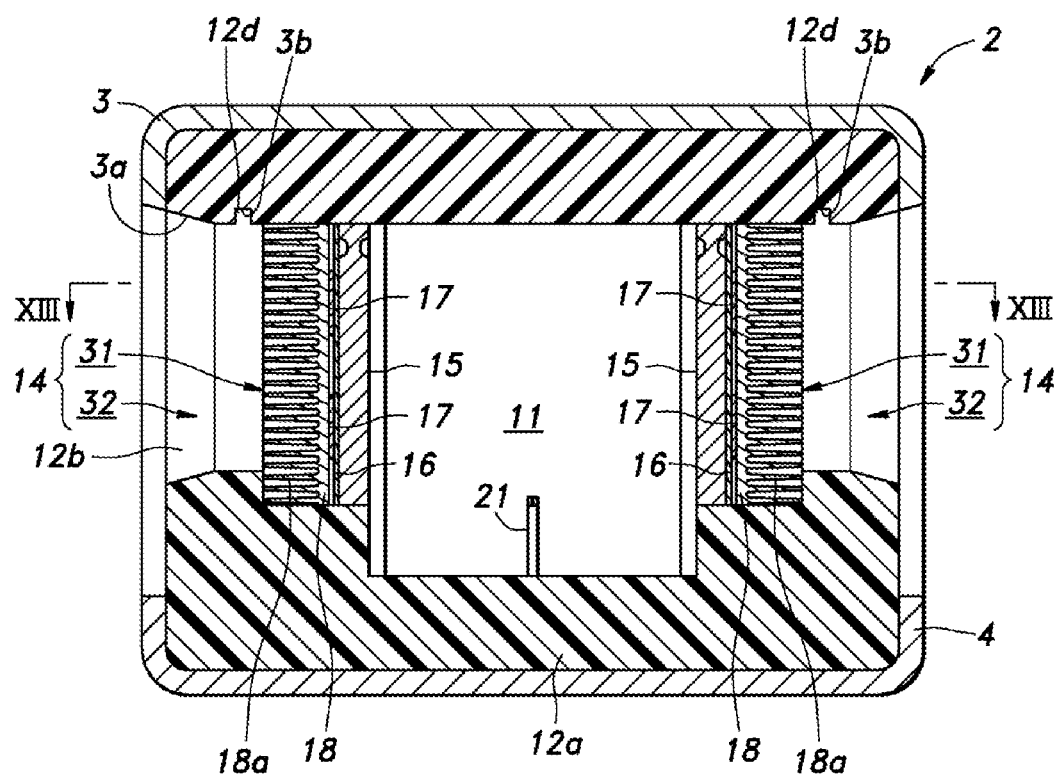
FIG. 12 is a cross-sectional view taken along line XII-XII in FIG. 11 and seen on the arrows.
Figure 13:
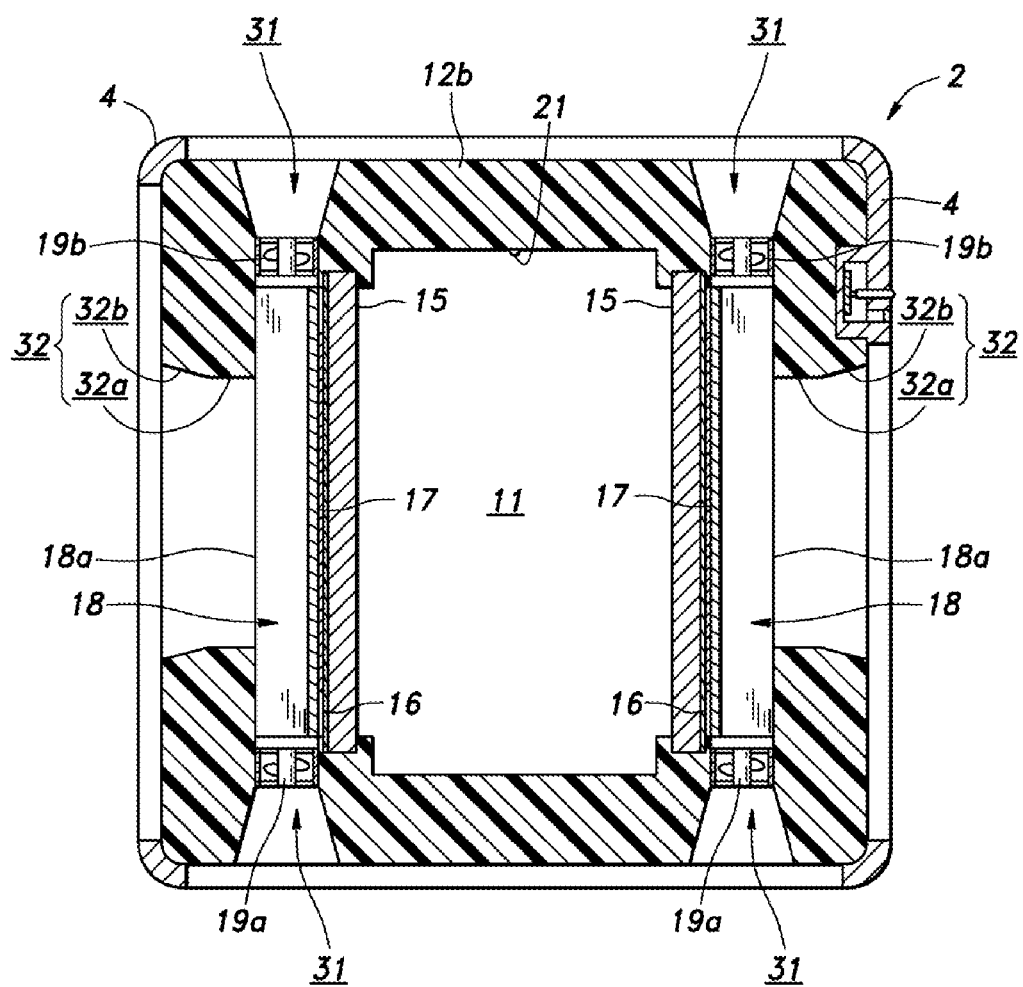
FIG. 13 is a cross-sectional view taken along line XIII-XIII in FIG. 12 and seen on the arrows.

FIG. 11 is a view showing the state where a lid body of a temperature maintaining case according to a second exemplary embodiment is removed, and corresponds to FIG. 3 described above. FIG. 12 is a cross-sectional view taken along line XII-XII of FIG. 11 and seen on the arrows, and corresponds to FIG. 4A described above. FIG. 13 is a cross-sectional view taken along line XIII-XIII in FIG. 12 and seen on the arrows, and corresponds to FIG. 4B. In connection with temperature maintaining case 1 according to the second exemplary embodiment, the matters not particularly referred to in the following are similar to the first exemplary embodiment, and therefore a detailed description is omitted. Further, in FIGS. 11 to 13, the constituent elements similar to those in the first exemplary embodiment are denoted by the identical reference characters.

Temperature maintaining case 1 according to the second exemplary embodiment is different from the first exemplary embodiment in the structure of outside air introducing passages 14. As shown in FIG. 11, outside air introducing passages 14 each includes first passage 31 extending along the base portion (the heat transferring surface on the outer side of thermoelectric device 17) of heatsink 18 and penetrating in the front/rear direction of main body 2, and second passage 32 that extends, in the direction (outward) crossing (herein, perpendicularly) heat transferring surface 17b, from the intermediate portion in the front/rear direction of first passage 31, the extending end of second passage 32 communicating with the outside. Thus, each outside air introducing passage 14 is an approximately T-shaped in a plan view.

Each first passage 31 has substantially the same structure as each outside air introducing passage 14 according to the first exemplary embodiment. Here, each first passage 31 is not only provided with two blower fans 19a provided one on top of the other in the front portion of main body 2, but also two blower fans 19b in a similar manner in the rear portion of main body 2.

Each second passage 32 is formed to penetrate through the right or left portion of circumferential wall 12b. Second passage 32 is formed to be groove-shaped opening toward the upper side of circumferential wall 12b. By closing the upper side opening by lid body 3 mounted on main body 2, second passage 32 forms the passage penetrating in the right/left direction of main body 2. Thus, as shown also in FIGS. 12 and 13, second passage 32 has straight passage portion 32a communicating with first passage 31, and widening passage portion 32b that is continuous from the outer side of straight passage portion 32a and gradually increases its width toward the opening on the right or left side.

On the right and left sides of temperature maintaining case 1, similarly to side plates 5 on the front and rear sides, side plates 35 that are hinge-connected at the lower edges so as to be openable in the top/bottom direction are provided. On the inner surface side of each side plate 35, projecting heat-insulating member 35a having a complementary shape to widening passage portion 32b so as to be accommodated by widening passage portion 32b in a buried manner is integrally provided. Thus, in a state where side plates 35 are totally closed relative to main body 2, projecting heat-insulating members 35a are packed into widening passage portions 32b, and the extending end sides of second passages 32 are shielded from the outside by using projecting heat-insulating members 35a.

In the power-saving operation mode of temperature maintaining case 1, the user sets side plates 5 and side plates 35 to a totally closed state relative to main body 2. Thus, projecting heat-insulating members 5a of side plates 5 and projecting heat-insulating members 35a of side plates 35 are respectively buried in widening passage portions 14b and widening passage portions 32b, whereby outside air introducing passages 14 are shielded from the outside. Thus, heat stored in heat storage members 15 is prevented from leaking outside.

In the normal operation mode of temperature maintaining case 1, the user sets side plates 5 and side plates 35 to a totally opened state relative to main body 2. Thereafter, the user causes blower fans 19a, 19b in first passages 31 to operate so as to discharge the air inside outside air introducing passages 14 to the outside (frontward and rearward). Thus, into outside air introducing passages 14, the outside air is introduced from the openings (the extending ends) of second passages 32. The introduced outside air flows in the approximately perpendicular direction to the base portion of each heatsink 18 (the heat transferring surface of each thermoelectric device 17), and the flow hits heatsink 18 and branches into the front and rear directions in each first passage 31, to be discharged to the outside by blower fans 19a, 19b.

In this manner, with temperature maintaining case 1 according to the second exemplary embodiment, by causing the outside air to hit each heatsink 18 and branching the flow into the front and rear directions, as compared to the first exemplary embodiment where the outside air flows from the one side to the other side respectively on the front and rear sides of main body 2, the temperature of the outside air being brought into contact with each heatsink 18 at the front and rear portions (opposite ends) of each first passage 31 can be leveled, which eventually makes it possible to suppress unevenness of the temperature in the storage chamber.

Further, since the introduced outside air flows toward the base portion of each heatsink 18 (approximately perpendicularly to the heat transferring surface on the outer side of each thermoelectric device 17), heat transfer between the outside air and heatsink 18 is promoted, and the cooling efficiency of the heat transferring surface by the outside air can be improved. The opening area of each second passage 32 as seen from the side should be set to be smaller than the area of heatsink 18. Further, as seen from the side, each second passage 32 should be disposed such that its entire opening overlaps with the base portion of heatsink 18.

Note that, with temperature maintaining case 1 according to the second exemplary embodiment, it is also possible to realize the cooling in the same manner as the first exemplary embodiment as necessary, by the user opening opposite side plates 5 relative to main body 2 and closing opposite side plates 35, and operating either blower fans 19a or blower fans 19b.

In the foregoing, the present disclosure has been described with the exemplary embodiments thereof. As can be easily understood by a person skilled in the art, the present disclosure is not limited to such exemplary embodiments, and can be modified as appropriate without departing from the spirit of the present disclosure. Further, not all the constituent elements shown in the exemplary embodiments are essential, and can be selected as appropriate without departing from the spirit of the present disclosure. For example, in the examples shown in the drawings, while heatsink 18 is disposed in each outside air introducing passage 14 that is provided to main body 2 and communicates with the outside, heatsink 18 may be provided such that heat transfer fins 18a are exposed at the surface of exterior member 4 to the outside. In this case, cap-shaped heat-insulating members covering heat transfer fins 18a may be formed, and the heat-insulating members should be removably attached to the surface of exterior member 4.

The temperature maintaining case of the present disclosure is useful as a temperature maintaining case that can switch between the temperature maintained state by a heat storage member and the temperature maintained state by a thermoelectric device as appropriate, for transporting a substance such as foods or cell tissue while maintaining the substance at a certain temperature.

What is claimed is:

1. A temperature maintaining case comprising:
    a main body having a recessed storage chamber formed by a heat-insulating wall;
    a lid body mounted on the main body capable of closing an opening of the storage chamber;
    a heat storage member exposed to the storage chamber in order to maintain a temperature in the storage chamber within a predetermined temperature range with reference to a target temperature;
    a thermoelectric device having a first heat transferring surface and a second heat transferring surface opposite to the first heat transferring surface, the first heat transferring surface being connected to the heat storage member;
    a control device configured to drive and control the thermoelectric device; and
    a cover member mounted on the main body,
    wherein the cover member is capable of selecting an exposed state in which the second heat transferring surface of the thermoelectric device is exposed to an outside, and a shielded state in which the second heat transferring surface of the thermoelectric device is shielded from the outside.

2. The temperature maintaining case according to claim 1, wherein:
    the heat storage member and the thermoelectric device are provided as being accommodated in the heat-insulating wall;
    the heat-insulating wall is provided with an outside air introducing passage for introducing outside air to the second heat transferring surface of the thermoelectric device; and
    the outside air introducing passage is opened or closed by selecting of the exposed state of the cover member or the shielded state of the cover member.

3. The temperature maintaining case according to claim 2, wherein
    the cover member has a projecting heat-insulating member buried and accommodated in the outside air introducing passage.

4. The temperature maintaining case according to claim 2, wherein
    the heat storage member is provided to constitute part of a wall of the storage chamber.

5. The temperature maintaining case according to claim 2, wherein:
    the second heat transferring surface of the thermoelectric device is formed of a heatsink attached to the thermoelectric device, and
    the heatsink has a portion exposed to the outside air introducing passage.

6. The temperature maintaining case according to claim 2, wherein:
    the outside air introducing passage penetrates through the main body, and
    a blower fan is disposed at least on one side of the outside air introducing passage.

7. The temperature maintaining case according to claim 1, wherein
    the main body has a temperature sensor configured to detect the temperature in the storage chamber, an alarm device configured to issue an alarm by at least one of light and sound, and an alarm control circuit configured to cause the alarm device to issue the alarm when the temperature in the storage chamber exceeds the predetermined temperature range with reference to the target temperature.

8. The temperature maintaining case according to claim 7, wherein
    the alarm control circuit uses, as a power supply in the exposed state, outer power supply providing member connected for supplying power to the thermoelectric device, and uses, as the power supply in the shielded state, the thermoelectric device.

9. The temperature maintaining case according to claim 8, further comprising
    a battery as an alternative power supply when the thermoelectric device generates small power.

10. The temperature maintaining case according to claim 1, wherein:
    lock member is provided between the lid body and the cover member for fixing the cover member together with the lid body to the main body, and
    the lock member is capable of locking when the cover member enters the shielded state.

11. The temperature maintaining case according to claim 2, wherein
    the outside air introducing passage includes:
    a first passage extending along the second heat transferring surface and having opposite ends each communicating with the outside; and
    a second passage extending from an intermediate portion of the first passage in a direction perpendicular to or crossing the second heat transferring surface, an extending end of the second passage communicating with the outside.

12. The temperature maintaining case according to claim 11, wherein
    the outside air is introduced from the extending end of the second passage.

* * * * *